(12) United States Patent
Nishio et al.

(10) Patent No.: US 10,461,488 B2
(45) Date of Patent: Oct. 29, 2019

(54) LASER DEVICE PROVIDED WITH FUNCTION OF PREDICTING OCCURRENCE OF CONDENSATION

(71) Applicant: FANUC CORPORATION, Minamitsuru-gun, Yamanashi (JP)

(72) Inventors: Akihiko Nishio, Yamanashi (JP); Yuji Nishikawa, Yamanashi (JP); Hiroyuki Yoshida, Yamanashi (JP); Hisatada Machida, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/151,890

(22) Filed: May 11, 2016

(65) Prior Publication Data

US 2016/0336707 A1    Nov. 17, 2016

(30) Foreign Application Priority Data

May 14, 2015    (JP) .................................. 2015-099014

(51) Int. Cl.
| | | |
|---|---|---|
| *H01S 3/04* | (2006.01) | |
| *G01K 13/00* | (2006.01) | |
| *H01S 5/00* | (2006.01) | |
| *H01S 3/00* | (2006.01) | |

(Continued)

(52) U.S. Cl.
CPC ............ *H01S 3/0407* (2013.01); *G01K 13/00* (2013.01); *H01S 3/0014* (2013.01); *H01S 5/0014* (2013.01); *H01S 3/1317* (2013.01); *H01S 5/02423* (2013.01)

(58) Field of Classification Search
CPC ........................... H01S 3/0407; H01S 5/02423
See application file for complete search history.

(56) References Cited

U.S. PATENT DOCUMENTS

| | | | | |
|---|---|---|---|---|
| 2004/0125850 A1* | 7/2004 | Hayashikawa | ......... | H01S 3/041 372/85 |
| 2010/0302463 A1* | 12/2010 | Matsumoto | ............ | G03B 21/16 348/744 |
| 2011/0243177 A1 | 10/2011 | Nishio et al. | | |

(Continued)

FOREIGN PATENT DOCUMENTS

| | | |
|---|---|---|
| CN | 102214889 A | 10/2011 |
| CN | 102377096 A | 3/2012 |

(Continued)

*Primary Examiner* — Tod T Van Roy
(74) *Attorney, Agent, or Firm* — RatnerPrestia

(57) ABSTRACT

A laser device provided with the function of predicting occurrence of condensation and preventing occurrence of condensation in advance. The laser device is provided with a controlling part calculating a reference temperature for judging whether a cooling water feed device may feed cooling water based on a temperature measured by a thermometer and a humidity measured by a hygrometer, and a comparing part comparing a reference temperature and a cooling water temperature. The cooling water feed device is configured to stop the feed of cooling water after a command for starting up the laser oscillator has been output and the cooling water temperature is lower than the reference temperature and to start or continue the feed of cooling water when the cooling water temperature is the reference temperature or more.

3 Claims, 5 Drawing Sheets

(51) Int. Cl.
*H01S 5/024* (2006.01)
*H01S 3/131* (2006.01)

(56) References Cited

U.S. PATENT DOCUMENTS

2013/0294470 A1* 11/2013 Watanabe ............... F25D 17/02
                                                        372/35
2014/0064309 A1*  3/2014 Schad .................... H01S 3/027
                                                        372/33
2015/0333467 A1* 11/2015 Tanaka ................ H01S 3/06704
                                                         372/6

FOREIGN PATENT DOCUMENTS

| JP | 61262476 A   | 11/1986 |
| JP | 63236650 A   | 10/1988 |
| JP | 02002187 A   | 1/1990  |
| JP | H04356981 A  | 12/1992 |
| JP | H06-260708 A | 9/1994  |
| JP | H07-029453 U | 6/1995  |
| JP | 07036464 U   | 7/1995  |
| JP | 08155669 A   | 6/1996  |
| JP | H09-083044 A | 3/1997  |
| JP | 2002057385 A | 2/2002  |
| JP | 2011049376 A | 3/2011  |

* cited by examiner

LASER DEVICE PROVIDED WITH FUNCTION OF PREDICTING OCCURRENCE OF CONDENSATION

BACKGROUND OF THE INVENTION

1. Field of the Invention

The present invention relates to a laser device provided with the function of predicting the occurrence of condensation in a laser oscillator.

2. Description of the Related Art

If condensation occurs in a laser oscillator, portions which should be electrically insulated from each other end up becoming electrically connected or the optical parts fall in performance and thereby operation of the laser oscillator is obstructed. To prevent such condensation, for example, JP H06-260708 A describes the art of feeding dry gas into the container housing the body of the laser oscillator to adjust the dew point at the inside of the container to become lower than the temperature of the cooling water.

Further, JP H09-083044 A describes a cooling device of a laser oscillator provided with a first feed pipe, a first discharge pipe, respectively a second feed pipe and second discharge pipe through which a laser power part is connected, and a flow rate adjustment mechanism which adjusts the cooling water flowing from the second feed pipe to the laser power part so that the temperature of a heat generating element etc. at this laser power part etc. is maintained at a certain temperature range.

On the other hand, art enabling the occurrence of condensation to be predicted in advance has been desired. For example, JP H07-029453 U does not cover a laser device, but discloses a device enabling automatic detection in prediction of condensation at an object surface at the time of bonding work or diagnosing a condensation environment inside a building and which can continuously record the trends in fluctuation.

If applying a device such as described in JP H07-029453 U to a laser device, it is understood that if occurrence of condensation were predicted, it would be possible to limit the operation of the laser oscillator by issuing a warning. However, in a laser device, to suitably adjust the temperature and humidity of the surroundings of the laser oscillator, sometimes the temperature/humidity adjusting device (air-conditioner etc.) for the housing of the laser oscillator is used, but if using such an adjusting device, since the temperature and humidity of the surroundings of the laser oscillator change along with the elapse of time, if standing by while leaving the adjusting device operating, sometimes condensation would be liable to no longer occur. It is not efficient to limit the operation of the laser oscillator up to such an event.

Further, if using cooling water, sometimes the temperature of the cooling water will change for some reason or another. As described in JP H07-029453 U, with just measuring the surface temperature of the object, at the time of measurement of temperature, it will be difficult to predict in advance the occurrence of condensation after the time of measurement of temperature due to the drop in temperature of the cooling water.

SUMMARY OF INVENTION

Therefore, the present invention has as its object the provision of a laser device provided with the function of predicting the occurrence of condensation and of preventing in advance the occurrence of condensation.

To achieve the above object, the present invention provides a laser device comprising a laser resonator generating laser light, a cooling water feed device feeding cooling water to the laser resonator for cooling the laser resonator, a water temperature gauge measuring a temperature of cooling water fed to the laser resonator, a temperature/humidity adjusting device adjusting at least one of a temperature and humidity of a space in which the laser resonator is set, a thermometer measuring a temperature of air adjusted by the temperature/humidity adjusting device, a hygrometer measuring a humidity of air adjusted by the temperature/humidity adjusting device, a controlling part calculating a reference temperature or reference humidity judging if the cooling water feed device may feed cooling water based on the temperature measured by the thermometer and the humidity measured by the hygrometer, and a comparing part comparing the reference temperature and the cooling water temperature or comparing the reference humidity and the humidity measured by the hygrometer, wherein the cooling water feed device configured to stop the feed of cooling water after a command for starting up the laser resonator has been output and the cooling water temperature is lower than the reference temperature or when the humidity measured by the hygrometer is higher than the reference humidity and to start or continue the feed of cooling water when the cooling water temperature is the reference temperature or more or when the humidity measured by the hygrometer is the reference humidity or less.

As a specific example, the reference temperature is a dew point of a space in which the laser resonator is placed or the dew point plus a predetermined margin, and the reference humidity is a condensation humidity of a space in which the laser resonator is placed or the condensation humidity minus a predetermined margin.

Further, the present invention provides a laser device comprising a laser resonator generating laser light, a cooling water feed device feeding cooling water to the laser resonator for cooling the laser resonator, a water temperature gauge measuring a temperature of cooling water fed to the laser resonator, a temperature/humidity adjusting device adjusting at least one of a temperature and humidity of a space in which the laser resonator is set, a thermometer measuring a temperature of air adjusted by the temperature/humidity adjusting device, a hygrometer measuring a humidity of air adjusted by the temperature/humidity adjusting device, a controlling part determining a control target temperature of cooling water which is fed to the laser resonator and calculating a reference temperature for judging if the cooling water feed device may feed cooling water based on the temperature measured by the thermometer and the humidity measured by the hygrometer, a water temperature adjusting device adjusting a temperature of cooling water fed to the laser resonator based on the control target temperature, and a comparing part comparing the reference temperature and the control target temperature, wherein the cooling water feed device configured to stop the feed of cooling water after a command for starting up the laser resonator has been output and the control target temperature is lower than the reference temperature and to start or continue the feed of cooling water when the control target temperature is the reference temperature or more.

As a specific example, the control target temperature is calculated and set so as to be held at the reference temperature or more and as such gradually fall in accordance with the fall in reference temperature.

As a specific example, the reference temperature is the dew point of a space in which the laser resonator is placed or the dew point plus a predetermined margin.

BRIEF DESCRIPTION OF THE DRAWINGS

The above-mentioned and other objects, features, and advantages of the present invention will become clearer by the following explanation of the preferred embodiments given with reference to the attached drawings.

DETAILED DESCRIPTION

Figure 1:
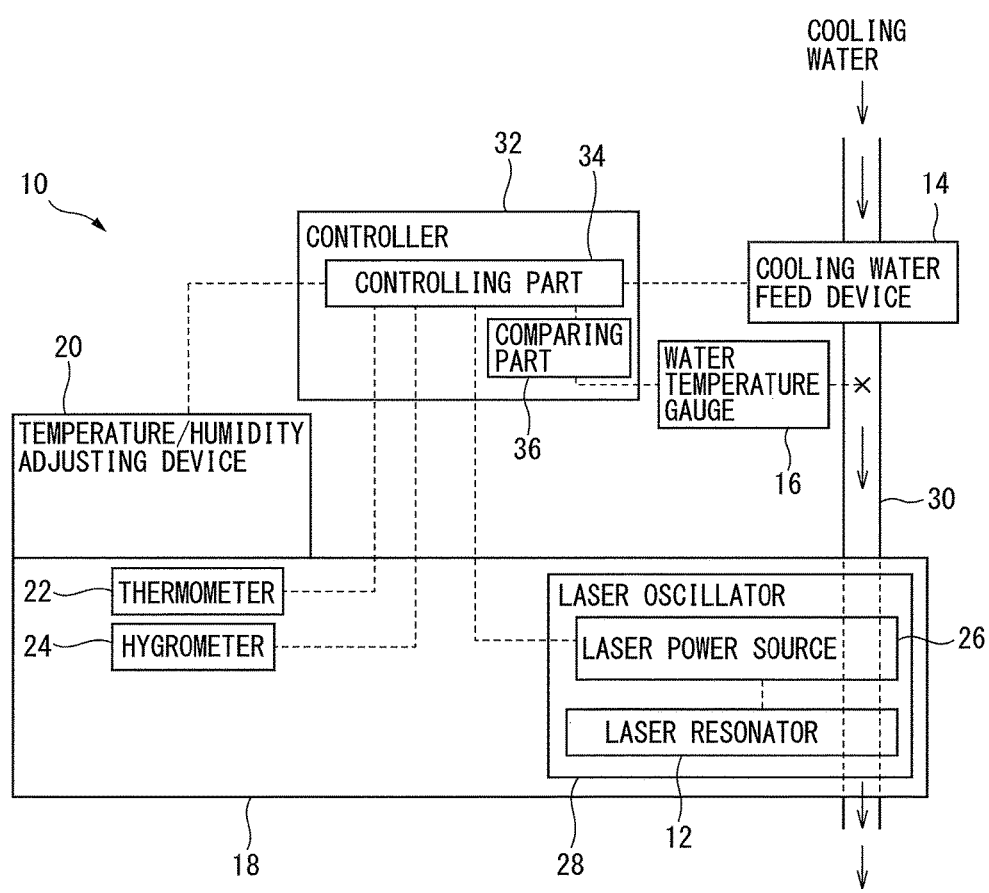
FIG. 1 is a view showing the schematic structure of a laser device according to a first embodiment of the present invention.

FIG. 1 is a view schematically showing the configuration of a laser device 10 according to a first embodiment of the present invention. The laser device 10 has a laser resonator 12 generating laser light, a cooling water feed device 14 feeding cooling water to the laser resonator 12, a water temperature gauge 16 measuring a temperature of cooling water fed to the laser resonator 12, a temperature/humidity adjusting device 20 adjusting at least one of a temperature and humidity of a space in which the laser resonator 12 is set (in the illustrated example the inside space of the housing 18), a thermometer 22 measuring a temperature of air in the space (housing 18) in which the laser resonator 12 is placed, and a hygrometer 24 measuring a humidity of air in the space (housing 18) in which the laser resonator 12 is placed.

In the illustrated example, the laser oscillator 28 including the laser resonator 12 and the laser power source 26 supplying power to the laser resonator 12 is placed in a housing 18. Further, the water temperature gauge 16 is configured to measure the temperature of the cooling water flowing through the inside of the cooling water path 30 which fluidly couples the laser resonator 12 and the cooling water feed device 14. Further, as the temperature/humidity adjusting device 20, for example, an air-conditioning system for adjusting the temperature and humidity of the air inside the housing 18, or a dry air feed device for feeding dry air to the inside of the housing 18, etc. can be used.

The laser device 10 has a controller 32 controlling the operations of the laser oscillator 28 and cooling water feed device 14. The controller 32 is provided with a controlling part 34 calculating a reference temperature (explained later) for judging if the cooling water feed device may feed cooling water based on the temperature measured by the thermometer 22 and the humidity measured by the hygrometer 24, and a comparing part 36 comparing the reference temperature and the cooling water temperature. The cooling water feed device 14 is configured to stop the feed of cooling water when cooling water temperature is lower than the reference temperature after a command for starting up the laser oscillator 28 has been output from the controller 32, and to feed (start or continue the feed of) cooling water when the cooling water temperature is the reference temperature or more after a command for starting up the laser oscillator 28 has been output from the controller 32.

The controller 34 can operate the cooling water feed device 14 and command whether to feed cooling water to at least one of the laser power source 26 and laser resonator 12. For example, when the cooling water feed device 14 has a solenoid valve provided at the cooling water path 30, it is possible to have the controller 34 send a command to the solenoid valve to operate that solenoid valve and thereby feed or stop cooling water to the laser oscillator 28. Alternatively, when the cooling water feed device 14 has a chiller provided with a pump, it is possible to have the controlling part 34 send a command to the chiller to start up or stop the pump and thereby feed or stop cooling water to the laser oscillator 28. Note that when the cooling water feed device 14 has a chiller, cooling water can be circulated for use.

Figure 2:
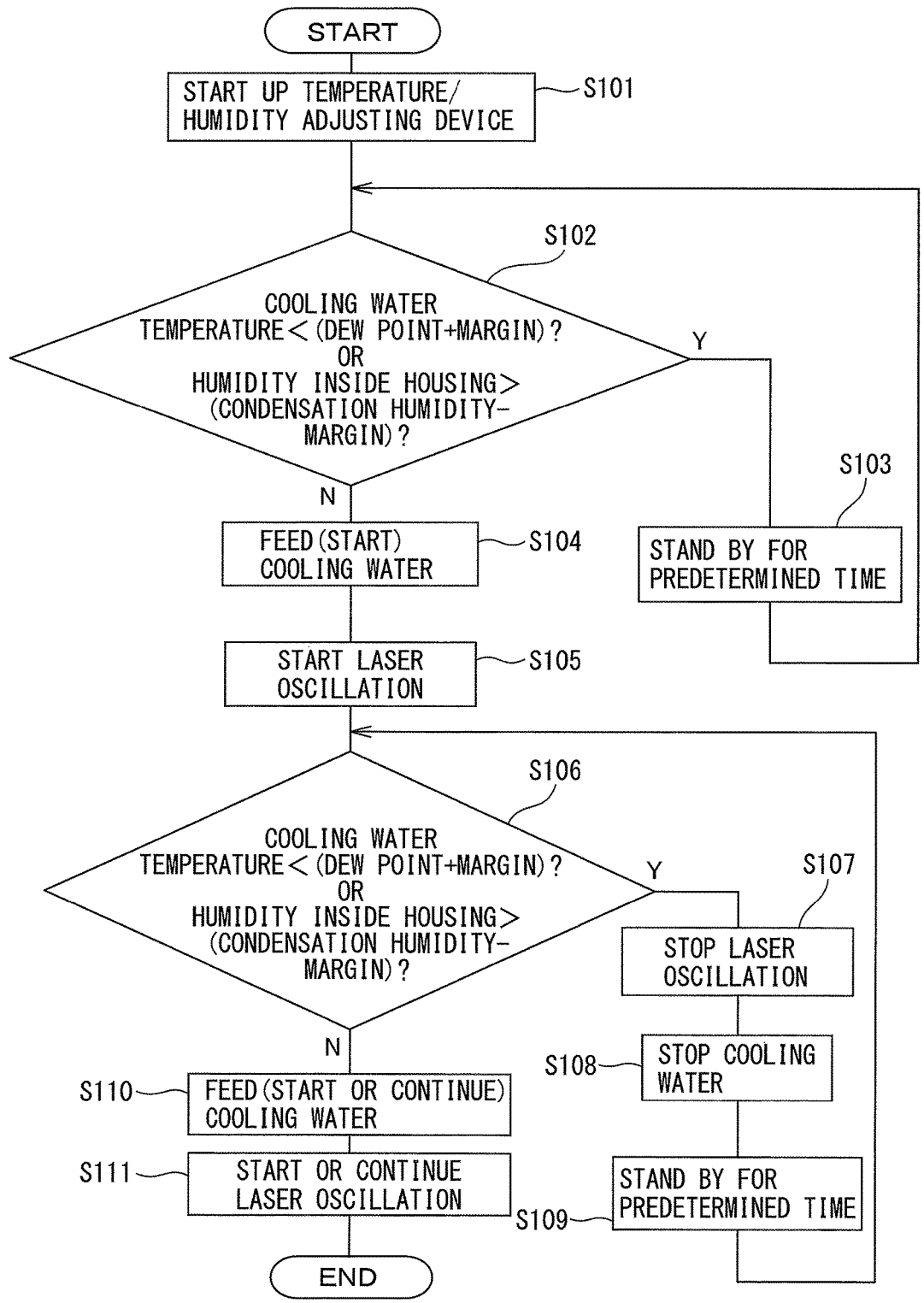
FIG. 2 is a flow chart showing an example of processing for starting up an oscillator in the laser device of FIG. 1.
Figure 3:
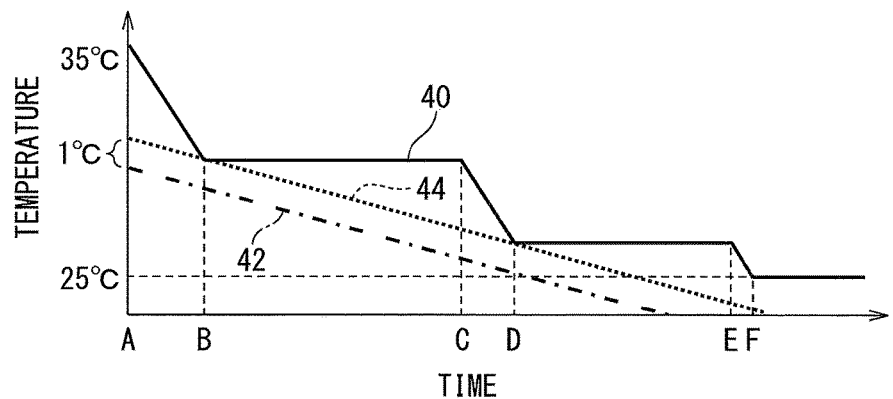
FIG. 3 is a graph showing one example of a change of the cooling water temperature along with time when the processing of FIG. 2 is performed.

FIG. 2 is a flow chart showing one example of processing for starting up the oscillator in the laser device 10 of FIG. 1, while FIG. 3 is a graph showing an example of the change of the cooling water temperature along with time (solid line 40) when the processing is performed. First, a command for starting up the laser oscillator 28 (laser resonator 12) (startup command etc.) is output, then the temperature/humidity adjusting device 20 is started up (step S101). Next, at step S102, the comparing part 36 compares the temperature of the cooling water measured by the water temperature gauge 16 and a reference temperature for judging whether the cooling water feed device 14 may feed cooling water.

The reference temperature is, for example, a value able to be calculated based on the dew point in the housing (space in which laser resonator 12 is placed) at the time of measurement of the temperature of the cooling water. In the example of FIG. 2 and FIG. 3, it is a value of a margin (constant) predetermined considering the error etc. of the measurement system added to the dew point. Alternatively, the dew point inside the housing itself may be made the reference temperature. Further, this margin can be determined by experience based on the specifications of the measurement system etc. For example, it can be made a constant value in the range of 0.5 to 2° C. (in the illustrated example, 1° C.)

When the cooling water temperature is lower than the reference temperature, the cooling water feed device 14 does not feed cooling water, but stands by for a predetermined time (step S103). That is, while the cooling water temperature is lower than the reference temperature, there is a possibility of condensation occurring at the laser resonator 12 etc., so laser oscillation is not started. Note that the predetermined time here, for example, can be made a constant value of 30 seconds to 5 minutes in range, but if the difference of the cooling water temperature and the reference temperature becomes smaller, it is also possible to shorten the predetermined time (that is, perform the processing of step S102 by a shorter period) and enable laser oscillation faster.

On the other hand, when the cooling water temperature is the reference temperature or more (corresponding to time A of FIG. 3), condensation will probably not occur at the laser oscillator 28, so the cooling water feed device 14 feeds (starts) the cooling water (step S104) and the laser oscillator 28 starts the laser oscillation (step S105).

At step S101 on, the temperature/humidity adjusting device 20 continuously operates, so as shown in FIG. 3, the humidity inside the housing 18 gradually falls. Along with this, the dew point (one-dot chain line 42) also gradually falls. Further, the reference temperature of the dew point plus a margin (in example of FIG. 3, 1° C.) (dotted line 44) also gradually falls. Note that when the cooling water feed device 14 has a chiller, the cooling water temperature falls toward the control target temperature of the chiller (in the example of FIG. 3, 25° C.)

Next, at step S106, in the same way as step S102, the temperature of the cooling water measured by the water temperature gauge 16 and the reference temperature at the time of measurement are compared. The reference temperature here also, in the same way as step S102, can be determined based on the dew point inside the housing at the time of measurement of the temperature of the cooling water. If the cooling water temperature falls below the reference temperature (time B of FIG. 3), there is a possibility of condensation occurring at the laser resonator 12 etc., so laser oscillation is stopped (step S107), the feed of the cooling water by the cooling water feed device 14 is stopped (step S108), and the system stands by for a predetermined time (step S109). The order of steps S107 and S108 may also be reversed or the steps may be performed simultaneously. Note that the predetermined time here also, for example, can be made a constant value of 30 seconds to 5 minutes in range, but if the difference between the cooling water temperature and the reference temperature becomes smaller, it is also possible to shorten the predetermined time and enable laser oscillation faster.

After waiting for a predetermined time, the dew point inside of the housing falls compared with the time B (therefore, the reference temperature also falls). When the cooling water temperature is the reference temperature or more (time C of FIG. 3), it is believed that condensation will not occur at the laser oscillator 28 or condensation will disappear, so the cooling water feed device 14 feeds (starts or continues) the cooling water (step S110) and the laser oscillator 28 starts or continues the laser oscillation (step S111).

The processing of step S106 on is intermittently performed during operation of the laser oscillator. Due to this, processing generally similar to that from the times A to C is repeated at the times C to E. Note that the time E on, the temperature of the cooling water is controlled so as to become the control target temperature (25° C.) (time F of FIG. 3).

In FIG. 3, from the time A to the time B, from the time C to the time D, and from the time E on, the cooling water feed device 14 feeds cooling water to the laser oscillator 28. On the other hand, from the time B to the time C and from the time D to the time E, the cooling water feed device 14 stops feed of the cooling water to the laser oscillator 28.

Note that as shown in FIG. 2, in one or both of step S102 and step S106, instead of comparing the cooling water temperature with the reference temperature, it is also possible to compare the humidity inside the housing 18 measured by the hygrometer 24 and the reference humidity for judging to have the cooling water feed device 14 feed cooling water. The reference humidity can, for example, be calculated based on the condensation humidity at the time of measurement of the humidity in the housing 18 (space in which laser resonator 12 is placed) and, for example, is the value of a margin (constant) predetermined considering the error or the measurement system etc. subtracted from the condensation humidity. Alternatively, the condensation humidity in the housing (humidity at which if exceeded condensation will occur) itself may be made the reference humidity. Further, this margin can be determined by experience based on the specifications etc. of the measurement system, for example, can be made a constant value in 1 to 10% (relative humidity) in range.

When using the reference humidity instead of the reference temperature, if the humidity inside the housing measured by the hygrometer 24 is higher than the reference humidity (measured humidity>reference humidity), there is a possibility that condensation will occur, so the cooling water feed device 14 does not feed cooling water and the system stands by for a predetermined time (step S103 or S107). On the other hand, when the measured humidity is the reference humidity or less, it is believed that condensation will not occur at the laser oscillator 28, so the cooling water feed device 14 starts or continues feed of cooling water (step S105 or S110) and the laser oscillator 28 performs laser oscillation.

In this way, in the first embodiment, it is possible to automatically perform the series of processing such as shown in FIG. 2, so if condensation is predicted to occur, it is possible to automatically perform the processing of leaving the temperature/humidity adjusting device 20 operating and making only the feed of cooling water stop to make the system stand by until conditions are reached where condensation will not occur (alternatively, if consideration occurs, stand by until condensation no longer occurs).

Figure 4:
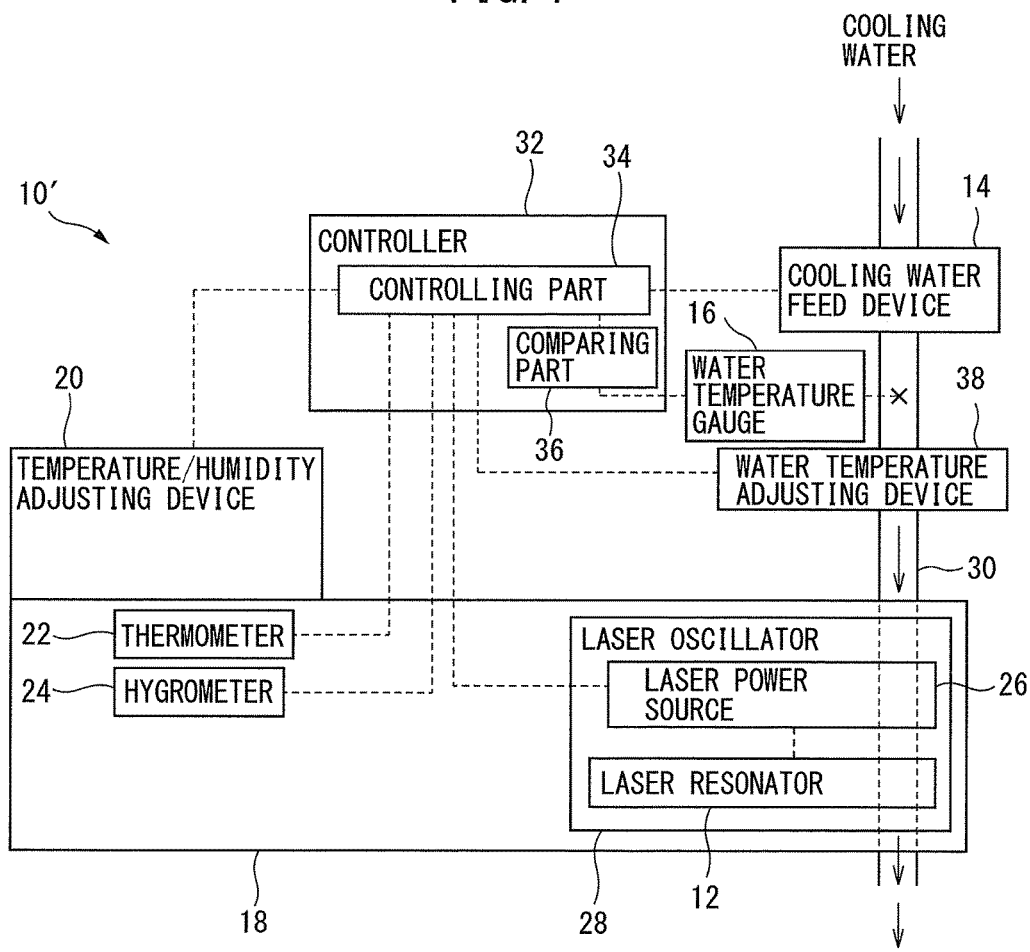
FIG. 4 is a view showing the schematic structure of a laser device according to a second embodiment of the present invention.

FIG. 4 is a view schematically showing the configuration of a laser device 10' according to a second embodiment of the present invention. The laser device 10' differs from the first embodiment in the point of having a water temperature adjusting device 38 adjusting the temperature of the cooling water fed from the cooling water feed device 14 to the laser oscillator 28. The water temperature adjusting device 38 is configured so as to adjust the cooling water temperature (to become equal to or approach the control target temperature) based on a predetermined control target temperature (explained later). In the example of FIG. 4, the water temperature adjusting device 38 has a heat exchanger provided at the cooling water path 30 and performing heat exchange between the cooling water flowing through the inside of the cooling water path 30 and the air outside of the housing 18. Further, the controlling part 34 is configured to set or calculate the control target temperature in addition to the reference temperature. Alternatively, the function of finding the control target temperature may be provided at the water temperature adjusting device 38 as well. The other component elements of the laser device 10' may be similar to the laser device 10 according to the first embodiment, so component elements having similar functions may be given the same reference notations and detailed explanations will be omitted.

Figure 5:
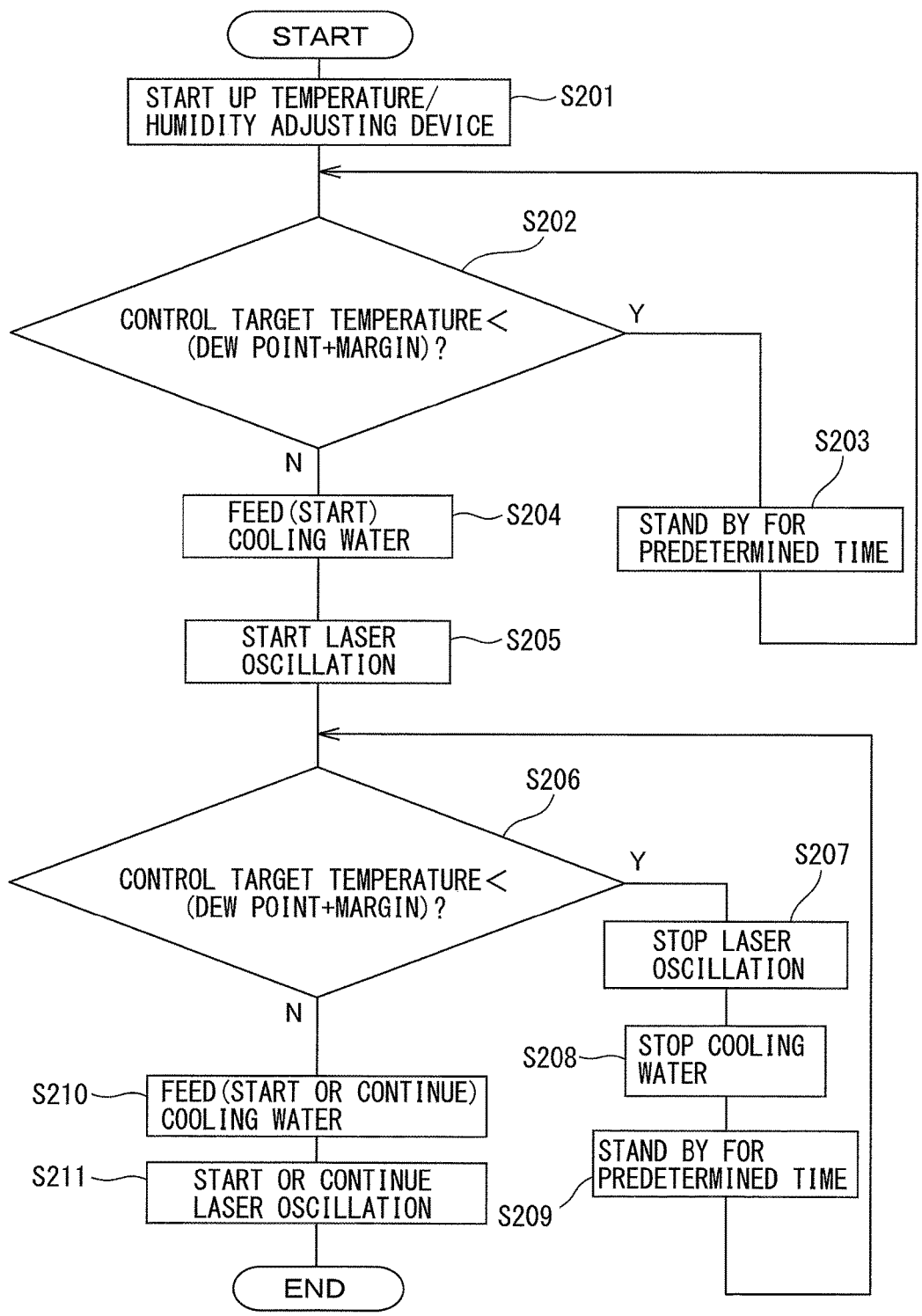
FIG. 5 is a flow chart showing an example of processing for starting up an oscillator in the laser device of FIG. 4.
Figure 6:
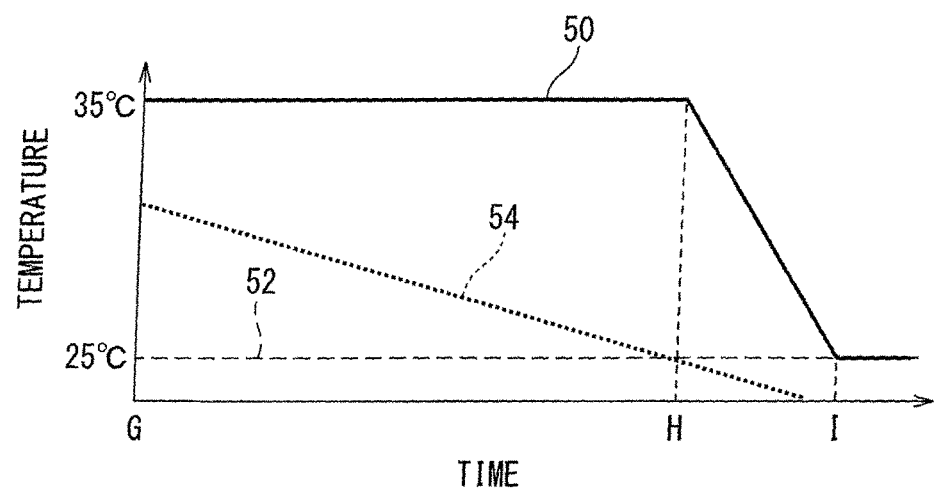
FIG. 6 is a graph showing one example of a change of the cooling water temperature along with time when the processing of FIG. 5 is performed.

FIG. 5 is a flow chart showing one example of the processing for startup of the oscillator in the laser device 10 of FIG. 4, while FIG. 6 is a graph showing one example of the change of the cooling water temperature along with time (solid line 50) when that processing is performed. First, after a command for startup of the laser oscillator 28 (laser resonator 12) (startup command etc.) is output, the temperature/humidity adjusting device 20 is started up (step S201). Next, at step S202, the comparing part 36 compares the control target temperature of the cooling water temperature resulting from the water temperature adjusting device 38 (broken line 52 of FIG. 6) and a reference temperature for judging whether the cooling water feed device 14 may feed cooling water (dotted line 54 of FIG. 6). Here, the control target temperature, for example, can be determined in advance experimentally as the cooling water temperature for cooling the laser resonator 12 so as to enable the laser resonator 12 to suitably perform laser oscillation or other operations. In the example of FIG. 6, it is set to a constant value (25° C.)

The reference temperature, in the same way as the first embodiment, for example, can be calculated based on the dew point in the housing at the time of measurement of the temperature of the cooling water. In the example of FIG. 5 and FIG. 6, it is a value of a margin (constant) predetermined considering the error etc. of the measurement system added to the dew point. Alternatively, the dew point inside the housing itself may be made the reference temperature. Further, this margin can be set by experience based on specifications of the measurement system etc., for example, can be made a constant value of 0.5 to 2° C. in range (in the illustrated example, 1° C.)

When the control target temperature is lower than the reference temperature (corresponding to times G to H of FIG. 6), the cooling water feed device 14 does not feed cooling water and the system stands by for a predetermined time (step S203). That is, the control target temperature being lower than the reference temperature means that if the cooling water temperature actually falls down to the control target temperature, the possibility of condensation occurring at the laser resonator 12 etc. is high, so laser oscillation is not started. Note that the predetermined time here, for example, can be made a constant value of 30 seconds to 5 minutes in range, but if the difference between the cooling water temperature and the reference temperature becomes smaller, it is also possible to shorten the predetermined time (that is, perform the processing of step S202 by a shorter period) and perform the laser oscillation faster.

At step S201 or more, the temperature/humidity adjusting device 20 continuously operates, so, as shown in FIG. 6, the humidity inside the housing 18 gradually falls. Along with this, the condensation point also gradually falls. Further, the reference temperature of the dew point plus a margin (dotted line 54) also gradually falls.

After standing by for a predetermined time, when the control target temperature becomes the reference temperature or more (time H of FIG. 6 and on), even if the cooling water temperature reaches the control target temperature, it is conceivable that condensation will not occur at the condensation laser oscillator 28, so the cooling water feed device 14 feeds (starts) cooling water (step S204) and the laser oscillator 28 starts laser oscillation (step S205).

Next, at step S206, in the same way as step S202, the control target temperature of the cooling water temperature resulting from the water temperature adjusting device 38 and the reference temperature for judging the feed of cooling water by the cooling water feed device 14 are compared. The control target temperature here as well can, for example, be determined in advance by experience as the cooling water temperature for cooling the laser resonator 12 so that the laser resonator 12 can suitably perform the laser oscillation or other operations. In the example of FIG. 6, it is set to the constant value (25° C.)

Further, the reference temperature, in the same way as step S202, can be determined based on the dew point in the housing at the time of measurement of the temperature of the cooling water. When for some reason or another the reference temperature exceeds the control target temperature, it is anticipated that condensation will occur in the laser resonator 12 etc., so the laser oscillation is stopped (step S207), the cooling water feed device 14 stops the feed of cooling water (step S208), and the system stands by for a predetermined time (step S209). The order of steps S207 and S208 may be reversed or the steps may be performed simultaneously. Note that the predetermined time here as well can, for example, be made a constant value of 30 seconds to 5 minutes in range, but if the difference between the cooling water temperature and the reference temperature becomes smaller, it is also possible to shorten the predetermined time and enable laser oscillation faster.

On the other hand, when the reference temperature is the control target temperature or more (time H of FIG. 6 on), it is believed that condensation will not occur at the laser resonator 12 etc., so the cooling water feed device 14 feeds (starts or continues) feed of cooling water (step S210) and the laser oscillator 28 starts or continues laser oscillation (step S211). The processing from step S206 on is performed intermittently during operation of the laser oscillator. Note that from the time I on, the temperature of the cooling water is controlled so that it becomes the control target temperature (25° C.)

In the example of FIG. 6, from the time G to the time H, the cooling water feed device 14 stops the feed of cooling water to the laser oscillator 28. From the time H on, the cooling water feed device 14 feeds cooling water to the laser oscillator 28. By making the object of comparison with the reference temperature the control target temperature of the cooling water, future condensation due to the fall in cooling water temperature can also be predicted and condensation can be more reliably prevented.

Figure 7:
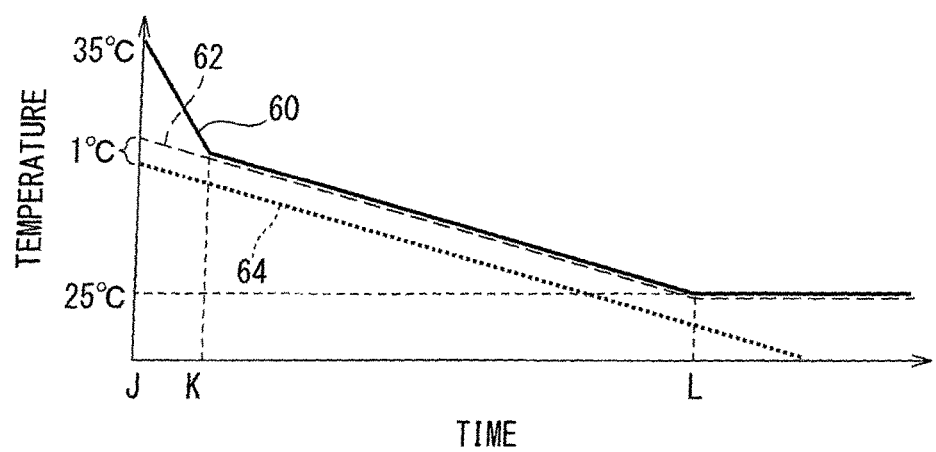
FIG. 7 is a graph showing another example of a change of the cooling water temperature along with time when the processing of FIG. 5 is performed.

FIG. 7 is a graph showing an example of the change in cooling water temperature along with time (solid line 60) in the second embodiment of the present invention in the case where the method of setting the control target temperature differs from the case of FIG. 6. In the example of FIG. 6, the control target temperature was a constant value, but in the example of FIG. 7, the controller 34 successively calculates the control target temperature and controls the water temperature adjusting device 38 based on the calculated control target temperature. Note that in the case of FIG. 7 as well, the flow chart relating to the processing for starting up the laser device may be similar to that of FIG. 5.

As shown in FIG. 7, the control target temperature (broken line 62) is calculated and set so as to be held at the reference temperature (dotted line 64) or more and as such to gradually fall in accordance with a fall in the reference temperature 64. For example, the control target temperature 62 is set to become the reference temperature 64 to the reference temperature plus a predetermined margin. In the illustrated example, the control target temperature 62 is set to a temperature higher than the reference temperature 64 by a constant value (for example, 0.5 to 2° C., in the illustrated example, 1° C.). However, the control target temperature is preferably set so as not to become lower than a lower limit value preset for suitable laser oscillation etc. (here, 25° C.). Therefore, in the example of FIG. 7, even if the "reference temperature +1° C." becomes lower than 25° C. (time L on), the control target temperature becomes 25° C.

Here, the control target temperature may be calculated and set so as to become equal to the reference temperature, but it is preferably set to become larger than the reference temperature by exactly a constant value (for example 0.5 to 2° C.). The reason is that the cooling water temperature is controlled so as to approach the control target temperature, but due to control error, for example, for a short time period of several tens of seconds or so, it sometimes ends up becoming lower than even the control target temperature. In this way, it is preferable to set a certain margin such as 1° C.

so that condensation will not occur even if the cooling water temperature becomes lower than the control target temperature.

As shown in FIG. 7, by setting the control target temperature at a value larger than the reference temperature by a constant value, it is possible to broaden the time span during which laser oscillation (feed of cooling water) is possible compared with the example of FIG. 6. In the example of FIG. 7, it is possible to prevent condensation from occurring over the entire time from when the cooling water temperature 60 is the initial 35° C. (time J) to when the cooling water temperature 60 is substantially equal to the control target temperature 62 (time K) and further the cooling water temperature 60 reaches 25° C. suitable for stable laser oscillation (time L) and on, so cooling water can be fed (laser oscillation can be performed) over a longer time.

According to the present invention, it is possible to predict condensation in the laser oscillator and, when the occurrence of condensation is predicted, automatically stop the feed of cooling water to prevent the occurrence of condensation in advance and automatically feed cooling water and generate a laser beam when stable laser oscillation is possible.

By making what the reference temperature is compared with the control target temperature of the cooling water, it is also possible to predict future condensation due to the fall in cooling water temperature and prevent that condensation. Further, by gradually lowering the control target temperature in accordance with the reference temperature, it is possible to start the feed of cooling water from an earlier stage and therefore possible to start the laser oscillation earlier.

While the invention has been described with reference to specific embodiments chosen for the purpose of illustration, it should be apparent that numerous modifications could be made thereto, by a person skilled in the art, without departing from the basic concept and scope of the invention.

The invention claimed is:

1. A laser device comprising:
   a laser resonator generating laser light,
   a cooling water feed device feeding cooling water to the laser resonator for cooling the laser resonator,
   a water temperature gauge measuring a temperature of cooling water fed to the laser resonator,
   a temperature/humidity adjusting device adjusting at least one of a temperature and humidity of a space in which the laser resonator is set,
   a thermometer measuring a temperature of air adjusted by the temperature/humidity adjusting device,
   a hygrometer measuring a humidity of air adjusted by the temperature/humidity adjusting device,
   a controlling part determining a control target temperature of cooling water which is fed to the laser resonator and calculating a reference temperature or a reference humidity for judging if the cooling water feed device may feed cooling water based on the temperature measured by the thermometer and the humidity measured by the hygrometer,
   wherein the reference temperature is a dew point in the space in which the laser resonator is placed, or a value calculated based on the dew point, and
   wherein the cooling water feed device is configured to repeat the following steps a plurality of times until the temperature of cooling water reaches the control target temperature:
   1) start or continue the feed of cooling water after a command for starting up the laser resonator has been output and when:
      a) the temperature of the cooling water is greater than the control target temperature, and
      b) the temperature of the cooling water is greater than or equal to the reference temperature, and
   2) stop the feed of cooling water when:
      a) the temperature of the cooling water is less than or equal to the control target temperature, or
      b) the temperature of the cooling water is less than the reference temperature.

2. A laser device according to claim 1, wherein the value calculated based on said dew point is said dew point plus a predetermined margin.

3. The laser device according to claim 1, wherein the controlling part is configured to intermittently:
   control the laser resonator to stop generating laser light when the temperature of the cooling water is lower than the reference temperature, and control the laser resonator to start or continue generating laser light when the temperature of the cooling water is the reference temperature or more.

* * * * *